United States Patent [19]
Avicola

[11] 4,073,572
[45] Feb. 14, 1978

[54] SYSTEM FOR INCREASING LASER PULSE RATE WITH BEAM SPLITTERS

[75] Inventor: Kenneth Avicola, Richland, Wash.

[73] Assignee: Jersey Nuclear-Avco Isotopes, Inc., Bellevue, Wash.

[21] Appl. No.: 660,650

[22] Filed: Feb. 23, 1976

[51] Int. Cl.² .................. G02B 27/14; B01D 59/44
[52] U.S. Cl. ........................ 350/174; 250/284
[58] Field of Search .......... 350/171, 172, 174, 169; 250/284

[56] References Cited
U.S. PATENT DOCUMENTS

| | | | |
|---|---|---|---|
| 3,427,629 | 2/1969 | Jacobs et al. | 350/174 |
| 3,510,657 | 5/1970 | Mangiaragina et al. | 350/174 |
| 3,772,519 | 11/1973 | Levy et al. | 250/284 |

*Primary Examiner*—Jon W. Henry
*Attorney, Agent, or Firm*—Weingarten, Maxham & Schurgin

[57] ABSTRACT

A system of wholly passive or static elements for increasing laser pulse rate by interleaving the pulses of a plurality of beams of pulsed laser radiation. The system of static elements includes an array of beam splitters which are operative to receive a plurality of beams of pulsed laser radiation and provide a plurality of output beams, each sharing the radiation in each of the input beams. The invention includes a methodology for expanding the array of beam splitter elements to combine any number of input beams, of whatever differing characteristics, to provide a corresponding number of output beams, each sharing a portion of the radiation in each of the input beams.

13 Claims, 7 Drawing Figures

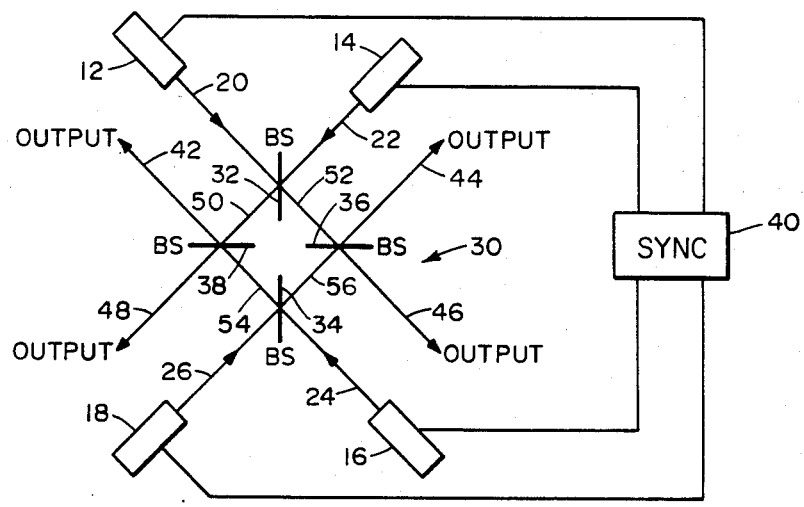
FIG. 1
FIG. 2
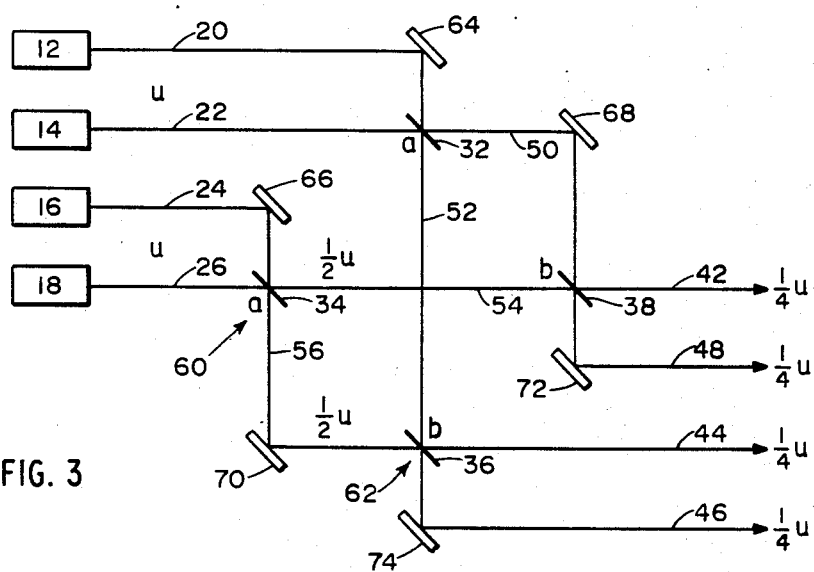
FIG. 3

SYSTEM FOR INCREASING LASER PULSE RATE WITH BEAM SPLITTERS

FIELD OF THE INVENTION

The present invention relates to the combining of beams of radiation.

BACKGROUND OF THE INVENTION

In high powered pulsed lasers of the type useful in isotope separation as described particularly for uranium enrichment in U.S. Pat. No. 3,772,519, it is desired for utmost efficiency to have a repetition rate measured in the thousands of pulses per second. Such rates may be difficult to achieve with present day laser technology in a single, high powered, pulsed laser, and it may be desired to avoid the use of rotating elements for beam combining as shown in U.S. Pat. No. 3,924,937.

BRIEF SUMMARY OF THE INVENTION

In the present invention, a technique of static elements is disclosed for combining a plurality of laser beams having time sequenced, pulsed radiation to achieve an augmented pulse rate. The technique may also be applied in a system for combining both time sequenced pulses and frequency distinct pulses for use in a system for isotope enrichment.

In the exemplary teaching of the preferred embodiment of the present invention, the combining system comprises an array of beam splitter elements. The array typically comprises a plurality of sets of beam splitters which include a set of input beam splitters and a set of output beam splitters and may include additional sets depending upon the number of beams to be combined. The input set of beam splitters responds on opposite sides of the beam splitting dielectric coating to distinct beams of pulsed radiation to transmit and reflect a predetermined percentage, typically 50 percent, onto two corresponding output paths, each having half of the radiation in each input beam. These output paths are applied to further beam splitter elements within the array. The output set also consists of a number of individual beam splitters which respond to radiation from the array to make the final combination of beams with each of the output beam splitter elements providing two output beams, each with a portion of the radiation from all of the time sequenced input pulses, and thus of augmented pulse rate.

Such a system may be provided for each of several colors of laser radiation in an isotope enrichment plant used for isotopically selective photoexcitation and a further combining system is provided for superposition of the respective colors, according to the teaching of commonly assigned U.S. patent application Ser. No. 660,649, filed Feb. 23, 1976 Robert S. Congleton, entitled SYSTEM FOR COMBINING LASER BEAMS OF DIVERSE FREQUENCIES, to achieve further composite beams which are not only augmented in pulse rate, but include various colors of laser radiation employed throughout the enrichment system.

BRIEF DESCRIPTION OF THE DRAWING

These and other features of the present invention are more fully set forth below in the detailed description of the preferred embodiment, presented for purposes of illustration and not by way of limitation and in the accompanying drawing of which:

FIG. 1 is a system diagram of a technique for augmenting the pulse rate using four lasers according to the teaching of the present invention;

FIG. 2 is a pulse timing diagram useful in explaining the principle of operation of the present invention;

FIG. 3 shows a modification of the system of FIG. 1 illustrating the invention in a form which permits its extension to greater numbers of inputs;

DESCRIPTION OF THE PREFERRED EMBODIMENT

Figure 4:
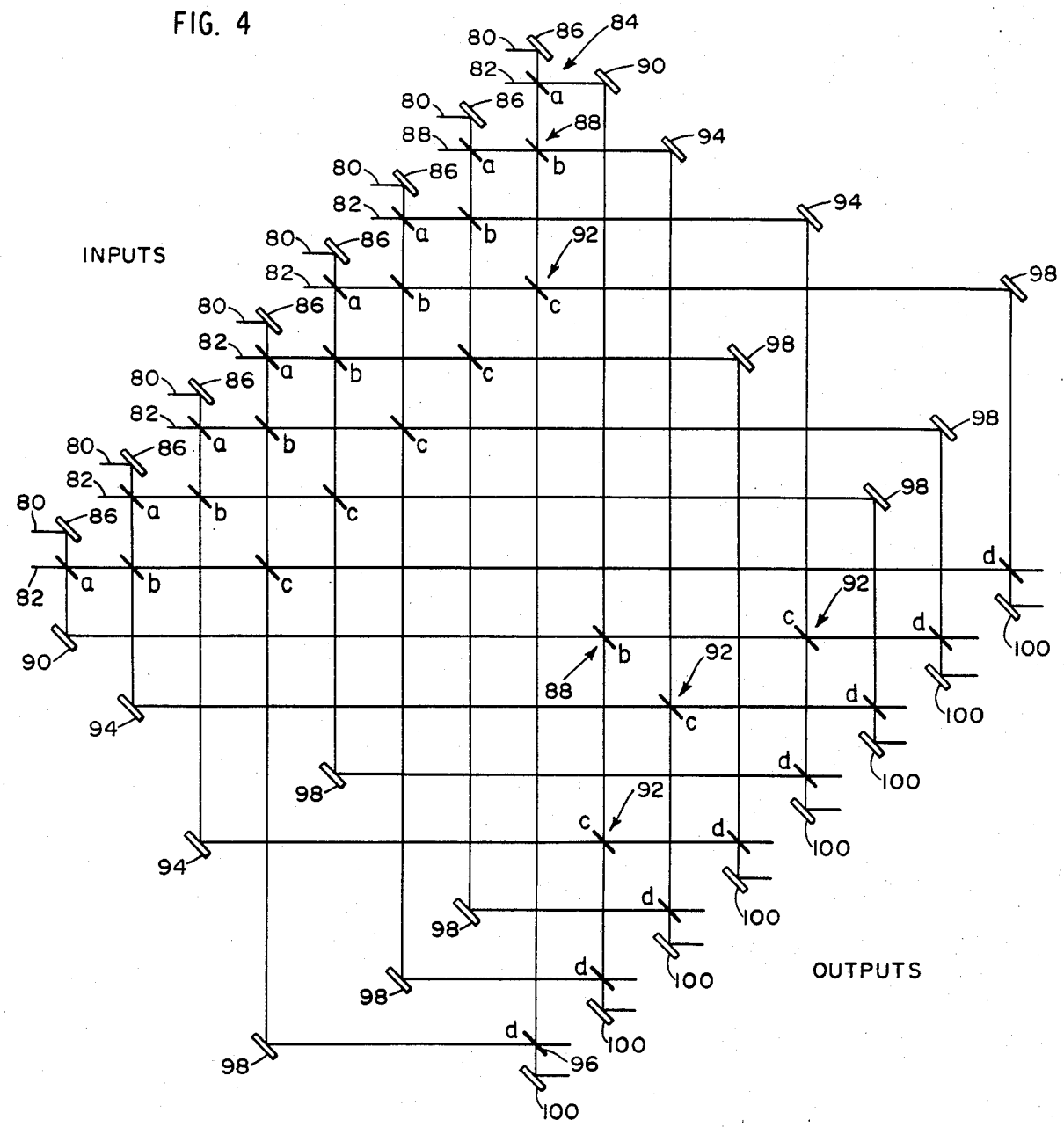
FIG. 4 is a diagram of an array of beam splitter elements for use in combining 16 pulsed laser sources.

The present invention contemplates a system for pulse rate augmenting including an array of beam splitter elements responsive to a plurality of laser beams of time sequenced, pulsed radiation. The array combines the beams into a plurality of output beams, each containing portions of the radiation of all of the input beams, thereby providing in each output beam a pulse rate higher, by a factor corresponding to the number of input beams, than can be achieved with a single laser source.

The principle of operation of the present invention is illustrated in FIG. 1 showing a system of four laser sources 12, 14, 16 and 18, which are typically monochromatic and limited in frequency and bandwith to provide isotopically selective photoexcitation of an isotope constituent of a plural isotope environment such as is illustrated in the above-identified U.S. Pat. No. 3,772,519 incorporated herein by reference and assigned to the same assignee as the present invention. Each laser has a respective output beam 20, 22, 24 and 26 which is applied to an array 30 of beam splitter elements 32, 34, 36 and 38. A synchronized trigger system 40 synchronizes each of the lasers 12, 14, 16 and 18 for sequential pulse activation in accordance with the timing diagram of FIG. 2, for example. In preferred application of the present invention to isotope separation the firing sequence provides an interval over which each laser is triggered once to provide an output pulse in the respective beams 20–26 where the pulse is evenly distributed throughout the interval. In this fashion four output beams 42, 44, 46 and 48 are provided, each containing a portion, in this case 25 percent, of the radiation in each of the input beams 20–26 and thereby having a pulse rate, as illustrated in FIG. 2, four times that of any individual beam 20–26.

To achieve this function, the radiation in beams 20 and 22 is applied to opposite faces of beam splitter 32. Beam splitter 32, as well as beam splitters 34, 36 and 38, is typically 50 percent reflective, 50 percent transmissive such that the beam splitter 32 provides two equal output beams 50 and 52. These are respectively applied to the beam splitter elements 38 and 36, along with output beams 54 and 56 from the beam splitter 34 which receives the input radiation beams 24 and 26. The resulting composite of the transmitted and reflected rays from the beam splitter 38 provide the output beams 42 and 48, while the output beams 44 and 46 are similarly provided from the beam splitter element 36.

The beam splitter elements 32–38 may employ dielectric coatings to achieve the preferred, 50 percent transmission, 50 percent reflection characteristic. All such dielectric coatings are well known in the art, a typical and exemplary coating will consist of a multitude of alternate high and low index of refraction quarter wavelength layers on one surface of a substrate and an antireflective coating on the other.

The laser system of FIG. 1 is shown in FIG. 3 in a modified form using mirrors to help to direct the laser beams throughout the array. The modified form of FIG. 3 permits the generalization of the pulse rate augmenting system of the present invention to a far greater number of lasers in an ordered methodology. As shown in FIG. 3, the beam splitters 32 and 34 form a first set 60 of diagonally positioned beam splitter elements, each identified by the letter $a$, while the beam splitters 36 and 38 form a second diagonal set 62, each identified by the small letter $b$. Mirrors 64 and 66 are provided to direct radiation from the lasers 12 and 16 respectively to the beam splitter elements 32 and 34 in the set 60. Additional mirrors 68 and 70 are employed to direct the respective beams 50 and 56 from element 32 to element 38 on the one hand and from element 34 to 36 on the other hand. Additional mirrors 72 and 74 are employed to receive the output beams 48 and 46, respectively, to provide parallel outputs. As can be seen in the FIG. 3 embodiment, at each splitting of an incident laser beam the power of each component of one of the original input beams 20–26 is halved such that the beams 50–56 each possess one-half of the original power, those being the beams between the first and second sets of beam splitter elements 60 and 62, while the outputs from the second set 62 possess one-quarter of the original energy.

Illustrated in FIG. 4 is a system for augmenting the pulse rate from 16 pulsed lasers, each providing an input beam of laser radiation labelled with the designation 80 or 82. Each input beam 80 or 82 is applied to one beam splitter element in a first set 84 of beam splitter elements each labelled $a$. Those beams labelled 80 are first reflected by one of a set of mirrors 86 to strike an opposite surface of the elements $a$. The output beams resulting from splitting by the elements in the set 84 are directed to respective different beam splitter elements of a second set 88 of beam splitter elements, each labelled with a designation $b$. Two mirrors each labelled 90 are employed for the radiation shown emanating outwardly from the array from the end elements $a$ in the first set 84 to direct it toward the last $b$ member of the set 88 shown elsewhere in the array. Similarly, the outputs from each element $b$, in the second set 88 of elements is directed to respective different beam splitter elements, labelled $c$, in a third set 92 of beam splitter elements. The output radiation from the two end elements on each side in the set 88 are reflected by mirrors 94 for application to three of the beam splitter elements, $c$, in the set 92. The last set 96 of beam splitter elements, $d$, each receives on opposite surfaces output radiation from a different element in the set 88 and for this purpose at least one of the inputs for each of the elements in the set 96 is reflected by one of the mirrors in a set 98 that reorients the radiation from one of the elements in the array of set 92. The outputs from the elements, $d$, in the set 96 provide the system outputs, each containing, in the case of 50 percent elements, one-sixteenth of the radiation power in each of the inputs. Mirrors 100 may be used for one of the outputs of each of the elements, $d$, in the set 96 to direct them all into parallel paths for use throughout a system of isotope enrichment.

Figure 5:
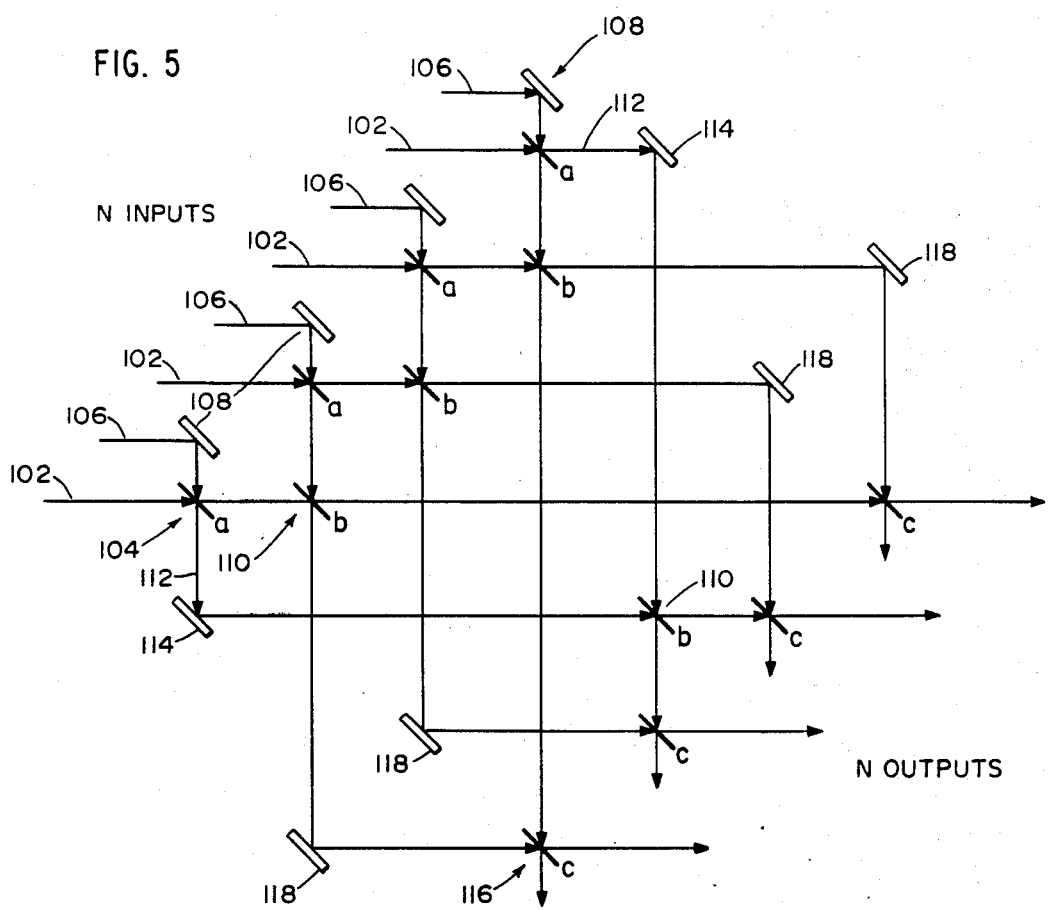
FIG. 5 is a generalized array of beam splitter elements illustrating the extension of the invention to any number of input laser sources.

A methodology which may be utilized for combining an indefinite number N of different laser inputs is illustrated with respect to FIG. 5. As shown there, each of the inputs are assumed to be provided in a parallel fashion as may be easily achieved using mirrors where desired. A first set of inputs 102 may be applied to a first set 104 of beam splitter elements, labelled $a$, on a first surface thereof and a second set of inputs 106 are reflected by a set of mirrors 108 for application to the opposite surfaces of the beam splitter elements, $a$, in the first set 104. The number N will be assumed to be one of the numbers defined by the expression $2^n$ where $n$ is an integer although it is apparent that some inputs may be lacking from an array of such a number N where desired. In this case, the number of mirrors in the set 108 will be one-half the number N and the number of beam splitter elements, $a$, in the set 104 as well as in all subsequent sets of beam splitter elements will also be equal to one-half N.

A second set of beam splitter elements 110, labelled $b$, is placed to receive the radiation from each of the radiation output beams of the first set 104 of elements $a$. In addition, since the output beams 112 at each end of the first set of elements 104 will diverge from the array, a set of mirrors 114 is required to redirect the radiation into the array for the last element $b$ in the set 110. The set 110 has N/2 elements in the set. The next set 116 of elements $c$ will require the use of twice as many mirrors 118 as the previous set and so on until the final output set of beam splitter elements in which case it will be necessary to employ as many mirrors as there are elements in the final or output set of beam splitter elements.

Figure 6:
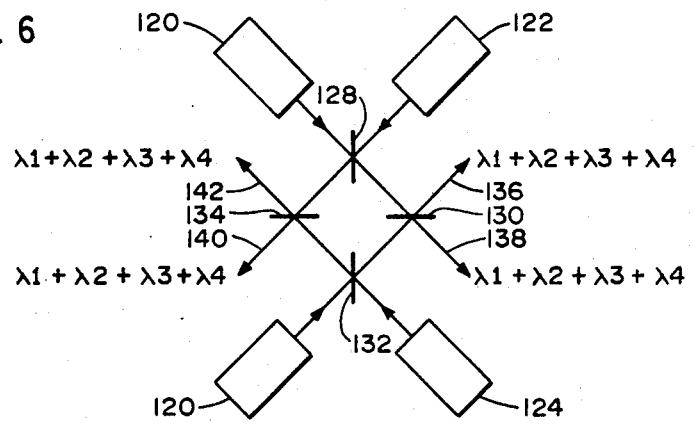
FIG. 6 is a system for statically combining plural colors of laser radiation according to another invention.

The system for pulse rate augmenting and power splitting illustrated above may be coupled with a system for laser color combining as illustrated in FIG. 6 and in United States patent application Ser. No. 660,649, filed Feb. 23, 1976, of Robert S. Congleton, for SYSTEM FOR COMBINING LASER BEAMS OF DIVERSE FREQUENCIES. As shown in FIG. 6, a system for combining four colors from lasers 120, 122, 124 and 126 of different frequencies employs a set of four beam splitter elements 128, 130, 132 and 134 in the configuration of FIG. 1, to provide four output beams 136, 138, 140 and 142, all identical where each of the beam splitters 128–134 is a 50 percent element.

Figure 7:
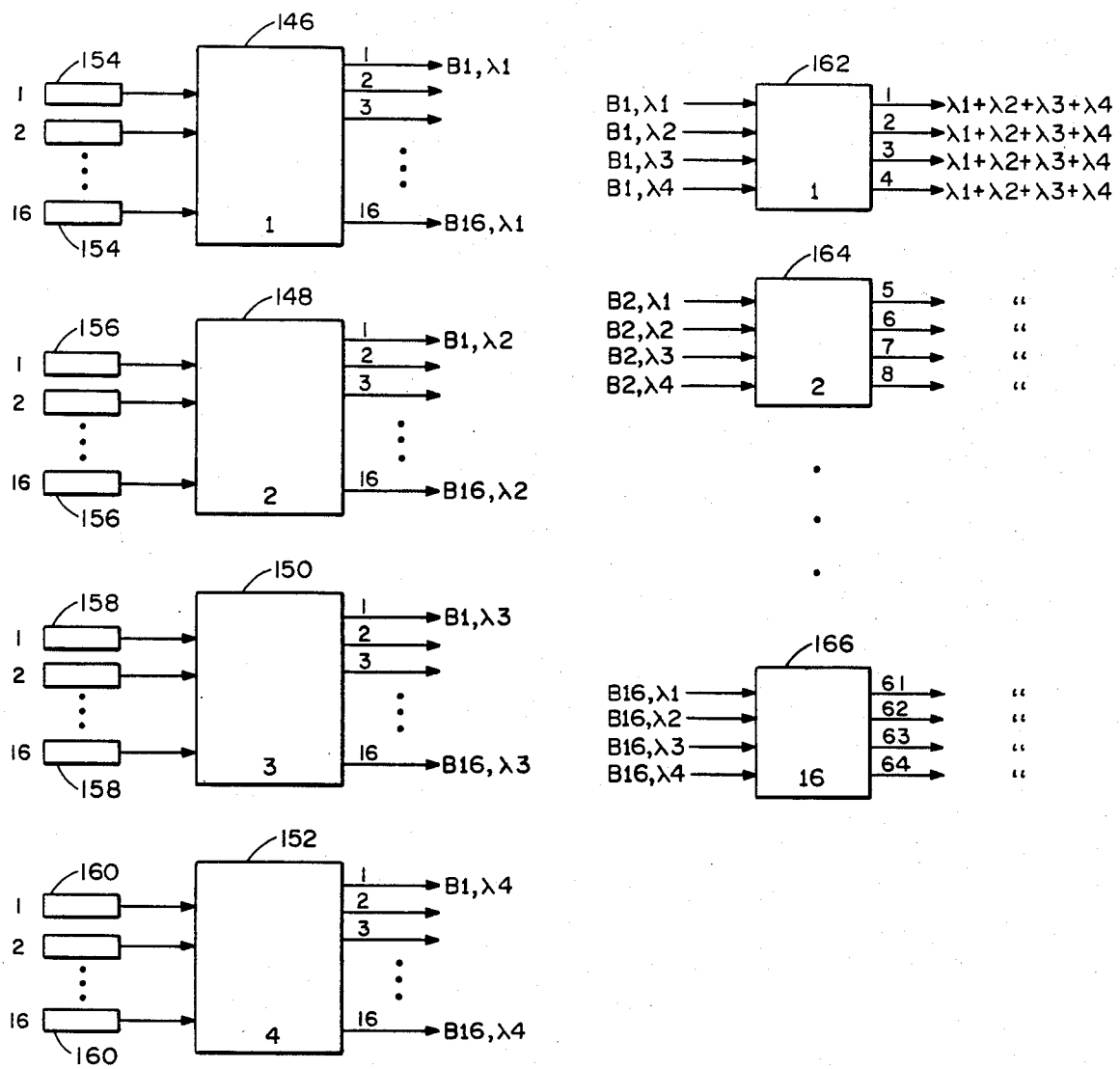
FIG. 7 is a diagram illustrating the use of the present invention with that illustrated in FIG. 6 for combining colors and at the same time augmenting pulse rate.

The system illustrated in FIG. 6 may be combined with the system for pulse rate augmentation as illustrated in FIG. 7 for a combined pulse rate augmentation and color superposition system. As shown in FIG. 7, a set of four pulse rate augmenting systems 146, 148, 150 and 152 are provided, each responsive to 16 inputs of laser radiation and, therefore, comprising a system as illustrated in FIG. 4. Each of the laser inputs for the system 146 is provided from pulsed and sequenced lasers 154 and each have the same color or frequency, typically tuned for uranium isotopically selective photoexcitation. For the pulse rate augmenting system 148, 16 lasers 156 are provided, each having the same color and time sequenced in the occurrence of the radiation pulses, but with the color of the lasers 156 typically distinct from the color of the lasers 154 and tuned for a different excitation or energy step in the process of isotopically selective photoexcitation and ionization as generally in the patent above cited. Similarly, the systems 150 and 152 receive inputs from the sets of 16 lasers 158 and 160. Typically, each of the frequencies for the lasers 154, 156, 158 and 160 will be distinct corresponding to four different wavelengths as labelled in the drawing. While the use of four frequencies represents a modification of the system shown in the above-identified U.S. patents, less than four may also be used.

Each of the systems 146–152 will provide 16 outputs labelled with the designations B1–B16 in the drawing of FIG. 7 and which will be of augmented pulse rate and equally divided power from each of the lasers 154–160. A set of 16 wavelength combining beam splitter systems 162, 164 . . . 166 are provided in accordance with the teaching of FIG. 6 and each having four inputs as shown there. One output from each of the pulse rate augmenting systems 146–152 is applied to one input of each of the 16 color combining systems 162–166. The result will be that a total of 64 outputs will be provided from the combined color combining systems 162–166, each output having an augmented pulse rate and including components of each of the colors which may typically be employed for isotope separation. The 64 outputs may then be employed for one or more isotope separation chambers of the type illustrated in the above-identified U.S. Pat. No. 3,772,519 or in modified chambers of the design illustrated in U.S. patent application Ser. No. 328,954, filed Feb. 2, 1973, now U.S. Pat. No. 3,939,354 incorporated herein by reference and all assigned to the same assignee as the present application. Or several beams may be applied to the same module as desired.

The above-described system is intended to be illustrative only, alternatives in the configuration of and design of components being intended to lie within the scope of the present invention. Accordingly, it is intended to limit the invention only in accordance with its definition in the following claims.

What is claimed is:

1. For use in a system for combining a plurality of beams of laser radiation of different characteristics, an array of beam splitter elements comprising:
    a plurality of sets of individual beam splitter elements;
    said plurality of sets including a set of input beam splitter elements receiving on opposite surfaces thereof the laser radiation from two of said plurality of laser beams of different characteristics;
    said plurality of sets of beam splitter elements including a set of output beam splitter elements with each element thereof receiving on opposite surfaces radiation from two different beam splitter elements of a further set of beam splitter elements other than said set of output beam splitter elements and operative to transmit and reflect a portion of each incident beam to provide two of said plurality of output beams, each beam containing radiation components of all of the input beams of pulsed laser radiation applied to said system; and
    a plurality of mirrors for directing radiation from one set of elements diverging from said array to elements of a further set of beam splitter elements.

2. The system of claim 1 wherein the number of sets of beam splitter elements equals $n$ and the number of said plurality of beams of laser radiation is $2^n$ or less where $n$ is an integer.

3. The system of claim 1 wherein the number of said mirrors is $2^n - 2$ where $n$ is the number of sets of beam splitter elements.

4. The system of claim 1 wherein the number of beam splitter elements in each of said plurality of sets is equal to at least one-half the total number of said beams of laser radiation of different characteristics.

5. The system of claim 4 wherein each of said plurality of sets of beam splitter elements contain the same number of beam splitter elements.

6. The system of claim 1 wherein said plurality of laser beams contain radiation all of the same frequency.

7. In a system for separating an isotope from an environment of plural isotopes, the system of claim 6 wherein said single frequency corresponds to an absorption line for said one isotope.

8. The system of claim 1 wherein the number of laser beams is equal to $2^n$ where $n$ is an integer.

9. The system of claim 8 wherein $n$ is equal to 4.

10. The system of claim 1 wherein:
    means are provided to generate said laser beams in pulses;
    an interval is defined by the length of time required for a single pulse of laser radiation to occur on each of said plurality of pulsed beams; and
    means are provided for providing an equal period of time between each pulse in said interval.

11. The system of claim 1 wherein each of said beam splitter element reflects and transmits an equal portion of the laser radiation incident thereon.

12. A system of static elements for combining pulsed laser radiation of plural colors to provide a plurality of composite beams of augmented pulse rate and multiple color content comprising:
    a plurality of systems according to claim 1 wherein the plurality of laser beams of each system are pulsed and of the same frequency and further wherein the frequencies for the pulsed laser beams differ from system to system;
    a plurality of means for combining the pulsed output laser beams of augmented frequency from the plural systems according to claim 1 and each comprising:
    an array of beam splitter elements receiving at least one output beam from each of said plurality of systems according to claim 1 and providing a plurality of output beams, each including a component of radiation from all of the input beams thereto, whereby each of said output beams includes radiation from each pulse of radiation in all the plurality of pulsed laser beams applied to the plurality of systems according to claim 1 and having all of the colors represented therein.

13. The system of claim 1 wherein each of said beam splitter elements includes:
    a substrate;
    an antireflective coating on one surface of said substrate; and
    and a plurality of dielectric, beam dividing layers, on the opposite surface of said substrate.

* * * * *